(12) United States Patent
Yamamoto

(10) Patent No.: US 7,548,116 B2
(45) Date of Patent: Jun. 16, 2009

(54) HIGH-FREQUENCY CIRCUIT OF REDUCED CIRCUIT SCALE

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 9 days.

(21) Appl. No.: 11/804,036

(22) Filed: May 15, 2007

(65) Prior Publication Data
US 2007/0285174 A1 Dec. 13, 2007

(30) Foreign Application Priority Data
May 29, 2006 (JP) .............................. 2006-147880
Aug. 18, 2006 (JP) .............................. 2006-223402

(51) Int. Cl.
*H03G 3/00* (2006.01)
(52) U.S. Cl. ...................... 330/284; 330/296; 330/291; 330/285
(58) Field of Classification Search ................. 330/284, 330/296, 291, 285
See application file for complete search history.

(56) References Cited

U.S. PATENT DOCUMENTS 5,383,223 A * 1/1995 Inokuchi ..................... 375/297
5,399,927 A * 3/1995 Gruber et al. ............... 327/379
6,069,528 A * 5/2000 Kashima ....................... 330/53
6,239,659 B1 * 5/2001 Grassle ........................ 330/282
6,271,727 B1 * 8/2001 Schmukler .................. 330/284
7,312,655 B2 * 12/2007 Kim ........................... 330/136
7,332,961 B2 * 2/2008 Blednov ..................... 330/149

FOREIGN PATENT DOCUMENTS

| JP | 5-4626 | 1/1993 |
| JP | 9-83295 | 3/1997 |
| JP | 10-65469 | 3/1998 |

* cited by examiner

*Primary Examiner*—Patricia Nguyen
(74) *Attorney, Agent, or Firm*—Beyer Law Group LLP

(57) ABSTRACT

A high-frequency circuit is provided. In the high-frequency circuit, a first PIN diode is provided in a signal line and a second PIN diode is provided between the signal line and ground so that an attenuating circuit is formed. A power supply is applied to one end of a series circuit composed of two resistors. The other end of the series circuit is connected to ground via a drain-source path of an FET. An AGC voltage is applied to a gate of the FET. A bias voltage in accordance with the AGC voltage is applied to a base voltage of a low-noise amplifier via the first and second PIN diodes so as t control attenuation of the first PIN diode and an operating current of the low-noise amplifier.

9 Claims, 8 Drawing Sheets

⟨EQUIVALENT CIRCUIT⟩

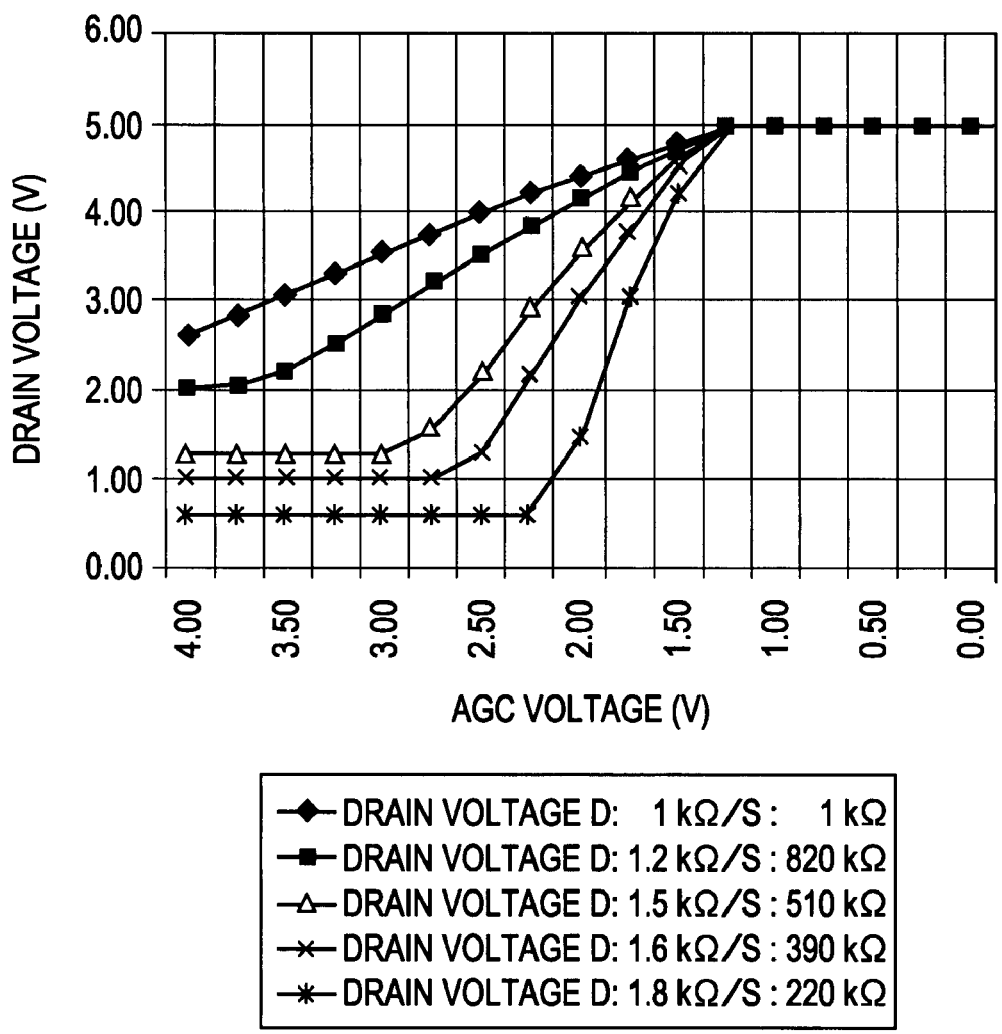

RF AGC CHARACTERISTIC AT 129-MHz RECEPTION

Pin ATT ATTENUATION CHARACTERISTIC

HIGH-FREQUENCY CIRCUIT OF REDUCED CIRCUIT SCALE

CLAIM OF PRIORITY

This application claims benefit of the Japanese Patent Application No. 2006-147880 filed on May 29, 2006 and Japanese Patent Application No. 2006-223402 filed on Aug. 18, 2006, which are hereby incorporated by reference.

BACKGROUND OF THE INVENTION

1. Field of the Invention

The present invention relates to a high-frequency circuit for controlling attenuation of an attenuating circuit including a PIN diode in accordance with an input signal level.

2. Description of the Related Art

In existing broadcast signal reception systems, an input signal, such as a television signal, received by an antenna is input to an attenuating circuit while the attenuation of the attenuating circuit is controlled by an AGC voltage provided by a detection circuit. When the input level of the television signal is too high, control is performed so that the attenuation increases. When the input level of the television signal is too low, control is performed so that the attenuation decreases. Thus, the input level of the television signal can be maintained to be a predetermined level. The input signal output from the attenuating circuit is amplified by a low-noise amplifier and is input to a downstream frequency conversion circuit.

FIG. 7 illustrates an example of a high-frequency circuit including an attenuating circuit disposed upstream of a low-noise amplifier. A television signal received by an antenna is delivered to an input terminal 10a of a television signal reception integrated circuit. One end of a signal line 11 is connected to the input terminal 10a whereas the other end of the signal line 11 is connected to an input end of a low-noise amplifier 12. A PIN diode D2 is disposed in the signal line 11. An anode of the PIN diode D2 is connected to the input end of the low-noise amplifier 12. A PIN diode D1 is connected between part of the signal line 11 on the cathode side of the PIN diode D2 and ground. A fixed voltage is generated by a direct current bias circuit composed of resistors R1 and R2. The fixed voltage is applied to an anode of the PIN diode D1 via a resistor 13. Another fixed voltage is generated by a bias circuit composed of resistors R3, R4, and R5. This fixed voltage is applied to the input end of the low-noise amplifier 12. Additionally, a bias circuit composed of a resistor R6 and a coil 14 applies an AGC voltage to the anode of the PIN diode D2 so as to drive the PIN diode D2 using the AGC voltage.

An antenna tuning circuit 21, an RF amplifier 22, an RF tuning circuit 23, a mixer 24, an IF tuning circuit 25, and an IF amplifier 26 that form a tuner unit are provided at an output end of the low-noise amplifier 12. An output end of the IF amplifier 26 is connected to an output terminal 10b of the television signal reception integrated circuit. A VIF integrated circuit 28 is connected to the output terminal 10b via an SAW filter 27. The VIF integrated circuit 28 incorporates an AGC circuit that generates an AGC voltage so as to output the AGC voltage in accordance with an input electric field. The AGC voltage is input to the bias circuit, which is dedicated to the PIN diode D2, and the RF amplifier 22. FIG. 8A is a characteristic diagram illustrating a relationship between the AGC voltage of the RF amplifier 22 and the attenuation. In the RF amplifier 22, the attenuation is very small in a low-level electric field range in which the AGC voltage is higher than about 3.5 V. However, the attenuation is gradually increased in a range from a medium electric field to a high electric field in which the AGC voltage is lower than 3.5 V.

The PIN diode D2 is a current-controlled diode. Therefore, in order to drive the PIN diode D2 using a direct current, an electric current of several mA needs to be applied to an AGC voltage supply line L1. The current capacity of the AGC circuit in the VIF integrated circuit 28 is smaller than that required for driving the PIN diode D2. Accordingly, the current capacity is increased by providing an AGC buffer amplifier 29 or 29' inside or outside the television signal reception integrated circuit.

When the AGC voltage is at a high level, a high voltage is applied from the bias circuit (the resistor R6 and the coil 14) to the anode of the PIN diode D2. Therefore, the PIN diode D2 becomes electrically conductive so that a large amount of electric current flows in the PIN diode D2. The input signal is input to the low-noise amplifier 12 without a decrease in the level thereof and is amplified. Furthermore, the input signal is amplified by the RF amplifier 22 to which the same AGC voltage is applied with high gain. In contrast, when the AGC voltage is at a low level, a low voltage is applied from the bias circuit (the resistor R6 and the coil 14) to the anode of the PIN diode D2. Therefore, a small amount of electric current flows in the PIN diode D2. Thus, an amount of electric current flowing to ground via the PIN diode D1 is relatively increased. As a result, the signal level input to the low-noise amplifier 12 is decreased. In this way, the attenuation is controlled in conjunction with the AGC voltage.

A high-frequency circuit is proposed that includes an attenuating circuit having a PIN diode upstream of an amplifying circuit so as to change the attenuation of the attenuating circuit in accordance with the input signal level (refer to, for example, Japanese Unexamined Patent Application Publication No. 10-065469)

However, in the above-described existing high-frequency circuit, the low-noise amplifier 12 cannot respond to a change in the input signal level because the bias voltage of the low-noise amplifier 12 is fixed, and therefore, the sensitivity of reception may deteriorate. In order for the low-noise amplifier 12 to respond a change in the input signal level, the low-noise amplifier 12 requires an additional circuit for supplying an AGC voltage to the low-noise amplifier 12. Therefore, the circuit scale may be disadvantageously increased.

In addition, to drive the PIN diode D2 disposed in the signal line 11, the existing high-frequency circuit requires the AGC buffer amplifier 29 or 29' inside or outside the television signal reception integrated circuit. Accordingly, the circuit scale is disadvantageously increased. In addition, standardization of circuits is disadvantageously prevented.

Furthermore, the operating point of the PIN diode D2 disposed in the signal line 11 cannot be freely set because the PIN diode D2 is directly driven by the AGC voltage. FIG. 8B illustrates the attenuation characteristic of an attenuating circuit having the PIN diode D2. As can be seen from FIGS. 8A and 8B, when the AGC voltage is greater than about 3.4 V, the attenuation is very small. However, when the AGC voltage is less than about 3.4 V, the attenuation starts to increase in the range from the low electric field to the medium electric field. It is desirable that the input signal is not attenuated in the range from the low electric field to the medium electric field, and the input signal is attenuated by operating the attenuating circuit from the high electric field range in which, for example, the AGC voltage is less than 1.5 V. However, even when the attenuation starts in the range from the low electric field to the medium electric field, the operating point cannot be freely determined. Therefore, the sensitivity of reception may deteriorate when a medium electric field is input.

SUMMARY OF THE INVENTION

Accordingly, the present invention provides a high-frequency circuit that can improve the sensitivity characteristic in a medium electric field and the distortion characteristic in a high electric field and that does not require an AGC buffer amplifier in an AGC voltage supply line so as to enable standardization of circuits and reduce the circuit scale thereof.

According to an embodiment of the present invention, a high-frequency circuit includes a first PIN diode disposed in a signal line to which a high-frequency signal is introduced, where one end of the first PIN diode on the high-frequency signal input side is connected to ground via a resistor, an amplifying device, where an input end of the amplifying device is connected to the other end of the first PIN diode for a direct current, a bias circuit connected to the input end of the amplifying device, and a variable bias circuit to which a control voltage is supplied from a control voltage supply line. The control voltage is applied to the control voltage supply line in accordance with the signal level of the input high-frequency signal. The variable bias circuit generates a variable bias voltage in accordance with the control signal and applies the variable bias voltage to the one end of the first PIN diode so as to control attenuation of the first PIN diode and control an operating current of the amplifying device.

In such a configuration, the variable bias circuit applies the variable bias voltage changed in accordance with the control voltage to the one end of the first PIN diode so as to control attenuation of the first PIN diode and control an operating current of the amplifying device. Accordingly, the operating current of the amplifying device can be controlled in accordance with the input signal level, and therefore, the sensitivity of reception can be improved compared with the case where a fixed voltage is applied to the amplifying device. In addition, the control voltage is supplied from the control voltage supply line to the variable bias circuit. The variable bias circuit generates a variable bias voltage that decreases with an increase in the control voltage and increases with a decrease in the control voltage so as to apply the variable bias voltage to the one end of the first PIN diode. Accordingly, the need for a buffer amplifier for increasing the capacity of a current that drives the first PIN diode from the control voltage supply line can be eliminated. Consequently, standardization of a circuit can be achieved and the circuit scale can be decreased.

In the high-frequency circuit, the variable bias circuit can include an FET having a gate connected to the control voltage supply line and a source connected to ground, and the variable bias circuit can further include two resistors connected in series between a drain of the FET and a power supply. A connection point of the two resistors can be connected to the one end of the first PIN diode.

In such a configuration, a current flowing in a drain-source path of the FET can be controlled by the control voltage applied to the gate from the control voltage supply line, and therefore, the bias voltage applied to the one end of the first PIN diode can be a variable bias voltage. In addition, the level of the variable bias voltage can be determined by the two resistors. Accordingly, the operating point of the first PIN diode can be freely determined. Thus, the sensitivity of reception can be improved when a medium electric field is input, although it has been difficult in existing high-frequency circuits.

In the high-frequency circuit, a second PIN diode can be connected between the one end of the first PIN diode and the connection point of the two resistors.

In such a configuration, since the variable bias voltage is applied to the second PIN diode, the electrically conductive state of the second PIN diode can be controlled. Thus, an amount of electric current flowing from the signal line to ground can be controlled by on and off of the second PIN diode.

In the high-frequency circuit, the amplifying device can include one of an FET and a transistor. The bias circuit can include a resistor connected between a gate or a base of the amplifying device and ground and a resistor connected between the gate or the base of the amplifying device and a power supply, and the bias circuit can apply a bias voltage applied to the gate or the base of the amplifying device to the other end of the first PIN diode.

Additionally, in the high-frequency circuit, an AGC voltage in accordance with a signal level of a high-frequency signal output from an AGC circuit connected to a stage downstream of the amplifying device can be used as the control voltage.

In addition, in the high-frequency circuit, the variable bias circuit can include an FET having a gate connected to the control voltage supply line, a source connected to ground via a resistor, and a drain connected to a power supply via a resistor, and the drain of the FET can be connected to the one end of the first PIN diode.

Furthermore, in the high-frequency circuit, the amplifying device can includes one of an FET and a transistor, and a direct current setting resistor can be connected between a source or an emitter of the amplifying device and ground. A source of the FET can be connected to ground for high frequencies, a third PIN diode can be connected between one end of a resistor having the other end connected to the source of the FET and the source or the emitter of the amplifying device, and the resistance value of the third PIN diode can be controlled by a source voltage of the FET.

In such a configuration, since the resistance value of the third PIN diode is controlled by a source voltage of the FET, the gain of the amplifying device can be controlled by the source voltage of the FET that is controlled by the control voltage in accordance with the input signal level. Accordingly, the gain of the amplifying device can be controlled by in accordance with the input signal level.

According to another embodiment of the present invention, a high-frequency circuit includes an attenuating circuit that includes a first PIN diode disposed in a signal line to which a high-frequency signal is introduced, an amplifying device connected to a stage downstream of the attenuating circuit, where the amplifying device includes a feedback circuit, and a variable bias circuit to which a control voltage is supplied from a control voltage supply line. The control voltage is applied to the control voltage supply line in accordance with the input signal level of the high-frequency signal. The variable bias circuit generates variable bias voltages supplied to the first PIN diode and the feedback circuit in accordance with the control voltage, the variable bias circuit controls attenuation of the first PIN diode using the variable bias voltage applied to one end of the first PIN diode and controls an amount of feedback of the feedback circuit using the variable bias voltage applied to one end of the third PIN diode.

According to a high-frequency circuit having such a structure, the variable bias circuit can provide two variable bias voltages in accordance with the level of an input high-frequency signal, that is, a variable bias voltage for controlling the attenuation of the attenuating circuit and a variable bias voltage for controlling the amount of feedback of the amplifying device.

In the high-frequency circuit, the variable bias circuit can include an FET having a gate connected to the control voltage supply line and a drain connected to a power supply via a resistor, the drain of the FET of the variable bias circuit can be connected to the one end of the first PIN diode, the source of the FET of the variable bias circuit can be connected to ground for high frequencies, one end of a resistor can be connected to the source of the FET, the amplifying device can include one of an FET and a transistor, a direct current setting resistor can be connected between a source or an emitter of the amplifying device and ground, a third PIN diode can be connected between the other end of the resistor connected to the source of the FET of the variable bias circuit and the source or the emitter of the amplifying device, and the resistance value of the third PIN diode can be controlled by a source voltage of the FET of the variable bias circuit.

Thus, the attenuation can be controlled using a drain voltage of the FET, and the amount of feedback of the amplifying device can be controlled using the source voltage of the FET.

According to the present invention, the base voltage of a low-noise amplifier can be changed in accordance with the level of an input signal, and the operating point of on and off control of the PIN diode in a signal line can be freely determined. Thus, the sensitivity characteristic in a medium electric field and the distortion characteristic in a high electric field can be improved. Furthermore, the need for an AGC buffer amplifier in an AGC voltage supply line can be eliminated, and therefore, the standardization of circuits can be achieved and the size of the high-frequency circuit can be reduced.

BRIEF DESCRIPTION OF THE DRAWINGS

FIG. 5 is a characteristic diagram illustrating a relationship between a drain voltage and an AGC voltage shown in FIG. 4A;

DESCRIPTION OF THE PREFERRED EMBODIMENTS

Exemplary embodiments of the present invention are described in detail below with reference to the accompanying drawings. In the following exemplary embodiments, the present invention is applied to a high-frequency circuit of a television receiver system.

First Exemplary Embodiment

Figure 1:
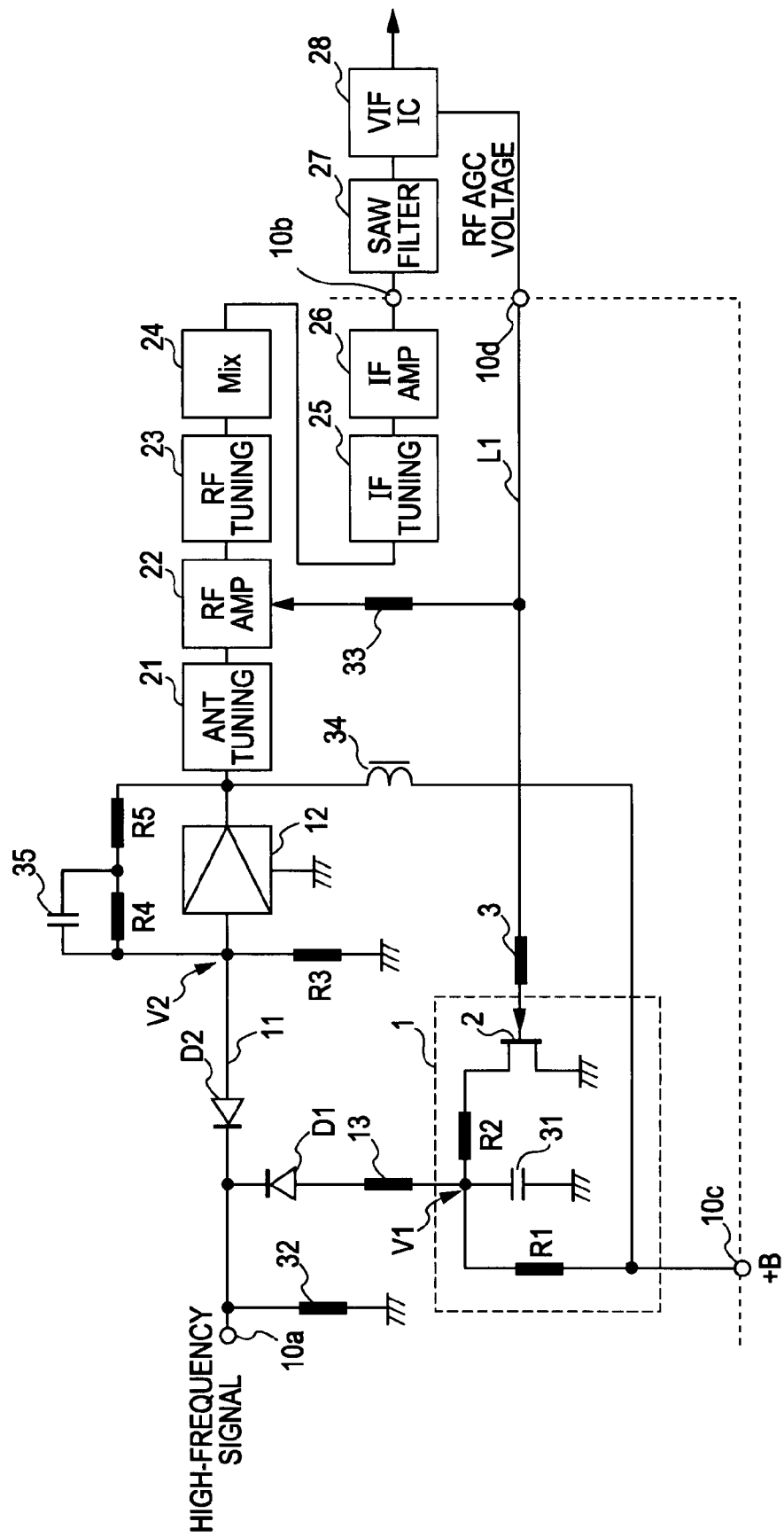
FIG. 1 is a block diagram of a high-frequency circuit according to a first exemplary embodiment of the present invention.

FIG. 1 illustrates an exemplary configuration of a high-frequency circuit according to a first exemplary embodiment. A high-frequency signal is supplied to an input terminal 10a. One end of a signal line 11 is connected to the input terminal 10a. The other end of the signal line 11 is connected to an input end of a low-noise amplifier 12. The low-noise amplifier 12 can be composed of an amplifying device, such as a dual-gate FET or a transistor. An attenuating circuit is disposed in the signal line 11 upstream of the low-noise amplifier 12. The attenuating circuit includes a PIN diode D2, which is a first PIN diode, and a PIN diode D1, which is a second PIN diode. A cathode of the PIN diode D2 is connected to the input terminal 10a whereas an anode of the PIN diode D2 is connected to the input end of the low-noise amplifier 12. A cathode of the PIN diode D1 is connected to the cathode of the PIN diode D2 whereas an anode of the PIN diode D1 is connected to ground via a resistor 13. Accordingly, the cathode of the PIN diode D2 is also connected to ground via the resistor 13. A variable bias circuit 1 is connected to the anode of the PIN diode D1.

The variable bias circuit 1 controls the attenuation of the PIN diode D2 using a variable bias voltage in accordance with an AGC voltage. In addition, the variable bias circuit 1 controls the operating electric current of the low-noise amplifier 12. The variable bias circuit 1 is composed of a combination of, for example, resistors R1 and R2 and an FET 2. One end of the resistor R1 is connected to a power supply terminal 10c to which a power supply B is applied. The other end of the resistor R1 is connected to one end of the resistor R2. The other end of the resistor R2 is connected to ground via a drain-source path of the FET 2. A gate of the FET 2 is connected to an AGC voltage supply line L1. The AGC voltage supply line L1 is connected to an AGC voltage application terminal 10d via a resistor 3. A connection point between the resistor R1 and the resistor R2 is connected to the other end of the resistor 13 and is also connected to ground via a capacitor 31.

In the variable bias circuit 1, a voltage V1 at a connection point of the resistor R1 and the resistor R2 is determined by a bleeder resistance ratio of the resistor R1 to the resistor R2. The voltage V1 changes in accordance with a value of a current flowing in the drain-source path of the FET 2. That is, with a decrease in the current flowing in the drain-source path of the FET 2, the voltage V1 increases. An amount of the current flowing in the drain-source path of the FET 2 is determined by the level of the AGC voltage applied to the gate of the FET 2.

The input end of the low-noise amplifier 12 is connected to ground via the resistor R3. In addition, the input end of the low-noise amplifier 12 is connected to the power supply terminal 10c via resistors R4 and R5 and a coil 34 which are connected in series. A capacitor 35 is connected to the resistor R4 in parallel. A DC bias voltage V2 determined by the resistors R3, R4, and R5 serves as a base voltage applied to the input end of the low-noise amplifier 12. In addition, the DC bias voltage V2 is applied to the anode of the PIN diode D2 so as to serve as a drive voltage that makes the PIN diode D2 electrically conductive. That is, the DC bias voltage V2 applied to the input end of the low-noise amplifier 12 makes the PIN diode D2 electrically conductive so that the need for the bias circuit (the resistor R6 and the coil 14) provided for the PIN diode D2 is eliminated.

According to the present embodiment, the resistance values of the resistors R1 and R2 are controlled so as to freely determine the operating points of the PIN diodes D2 and D1. More particularly, in a low electric field range in which the AGC voltage is maximized, the voltage V1 (the minimum value) is set so that the PIN diode D1 is in an open state and the voltage V1 is less than the bias voltage V2 determined by a bias circuit (the resistors R3, R4, and R5) of the low-noise amplifier 12. Thus, in a low electric field range, the PIN diode D1 can be made to be in an open state and the PIN diode D2 can be made electrically conductive by the bias voltage V2 of the low-noise amplifier 12.

In a medium electric field range in which the AGC voltage is decreased from the maximum value by some amount, the voltage V1 is changed to the bias voltage V1 so that the PIN diode D1 moves from an open state to a conductive state and the PIN diode D2 moves from a conductive state to an open state. As the cathode voltage (V1) of the PIN diode D2 increases, the bias voltage of the low-noise amplifier 12 increases. Therefore, the operating current of the low-noise amplifier 12 increases. At that time, the bias voltage is determined so that the NF is optimum for the low-noise amplifier 12.

In a high electric field range in which the AGC voltage is further decreased from the maximum value, the bias voltage V1 is set so that the PIN diode D1 is completely electrically conductive and a high operating current sufficient for improving the distortion characteristic flows in the low-noise amplifier 12, and the bias voltage V1 is applied to the cathode of the PIN diode D2. Thus, in a high electric field range, the PIN diode D2 is turned off and a high voltage (the bias voltage V1) is applied to the input end of the low-noise amplifier 12 by the variable bias circuit 1. As a result, the operating current increases.

An antenna tuning circuit 21, an RF amplifier 22, an RF tuning circuit 23, a mixer 24, an IF tuning circuit 25, and an IF amplifier 26 are disposed downstream of the low-noise amplifier 12 so as to form a tuner unit. An output end of the IF amplifier 26 is connected to the output terminal 10b of the television signal reception integrated circuit. The antenna tuning circuit 21 tunes the frequency range of a television broadcast signal to retrieve the television broadcast signal. The RF amplifier 22 amplifies the television broadcast signal with a gain in response to a gain according to the AGC voltage. The RF tuning circuit 23 synchronizes with a tuning frequency selected in accordance with a tuning signal so as to retrieve a predetermined television signal. The mixer 24 transforms the frequency by multiplying the predetermined television signal by a local oscillation signal. The IF tuning circuit 25 retrieves an IF signal of a frequency component corresponding to a desired television signal from the frequency-transformed IF signal. The IF amplifier 26 amplifies the IF signal retrieved by the IF tuning circuit 25 and outputs the IF signal from the output terminal 10b. A SAW filter 27 removes unwanted frequency components of the IF signal output from the output terminal 10b and outputs the IF signal to a VIF integrated circuit 28. The VIF integrated circuit 28 incorporates an AGC circuit that generates an AGC voltage used for limiting the input signal level to within a predetermined range in accordance with the level of the input IF signal. The AGC voltage output from the AGC circuit of the VIF integrated circuit 28 is applied to the AGC voltage application terminal 10d. In addition, the VIF integrated circuit 28 demodulates the IF signal so as to output a video signal and an audio signal.

The operation of the present embodiment having such a configuration is described next.

The VIF integrated circuit 28 receives the IF signal from the tuner unit and outputs an AGC signal in accordance with the level of the input electric field from the AGC circuit. The AGC voltage is output on the basis of an AGC curve determined so that the voltage value gradually decreases from the low electric field range to the high electric field range. The AGC voltage output from the VIF integrated circuit 28 is applied to the RF amplifier 22 and the gate of the FET 2 via the AGC voltage supply line L1.

When the AGC voltage is maximized, the FET 2 becomes electrically conductive, and therefore, an amount of current flowing in the drain-source path increases. Accordingly, the voltage V1 is minimized. At that time, according to the above-described settings, the voltage V1 applied to the anode of the PIN diode D1 causes the PIN diode D1 to enter an open state in which the PIN diode D1 is turned off. In contrast, the PIN diode D2 becomes electrically conductive due to the bias voltage V2 of the low-noise amplifier 12 applied to the anode thereof. Therefore, in a low electric field range in which the AGC voltage is maximized, a high-frequency signal introduced by the signal line 11 is input to the low-noise amplifier 12 without the level of the high-frequency signal being decreased by the PIN diode D2 in the conductive state. The low-noise amplifier 12 performs an amplifying operation due to the bias voltage V2. The low-noise amplifier 12 amplifies the input signal and outputs the amplified signal. Since the AGC voltage in a low electrical field range does not make the PIN diode D1 electrically conductive due to the voltage V1 or makes the PIN diode D1 electrically conductive at a level that does not affect the reception sensitivity, attenuation of a signal is prevented.

When the AGC voltage is decreased and preferably made to reach a desired operating point in a medium electric field range, the amount of current flowing in the drain-source path of the FET 2 decreases, and therefore, the voltage V1 increases. The anode voltage of the PIN diode D1 increases so that the PIN diode D1 changes from an open state to a conductive state. At the same time, the cathode voltage (V1) of the PIN diode D2 increases so that the PIN diode D2 changes from the conductive state to an open state. Thus, an electric current flows from the signal line 11 to ground due to the conductive state and the open state of the PIN diodes D1 and D2, respectively, and therefore, the input signal level is decreased. In addition, when the cathode voltage (V1) of the PIN diode D2 increases in accordance with the decrease in the AGC voltage and the PIN diode D2 changes to an open state, a voltage applied to the input end of the low-noise amplifier 12 from the cathode side of the PIN diode D2 is increased. The increase in the base voltage of the low-noise amplifier 12 increases the amount of operating current of the low-noise amplifier 12. Thus, the low-noise amplifier 12 operates in the optimum NF state due to the above-described settings. Consequently, an amplified signal having the improved NF in a medium electric field range can be output.

When the AGC voltage is further decreased and preferably made to reach a high electric field range, the AGC voltage applied to the gate of the FET 2 is increased. Accordingly, the amount of current flowing in the drain-source path of the FET 2 decreases or is turned off. Accordingly, the voltage V1 is maximized at a connection point between the resistor R1 and the resistor R2. Since this maximized voltage V1 is applied to the anode of the PIN diode D1, the PIN diode D1 becomes completely electrically conductive. In addition, the cathode voltage of the PIN diode D2 is increased due to the increased voltage V1, and the PIN diode D2 also enters a substantially open state. Therefore, a large amount of electric current flows from the signal line 11 to ground through the PIN diode D1. Consequently, the attenuation is maximized. Furthermore, since the voltage V1 at a high level is applied to the cathode of the PIN diode D2, the base voltage of the low-noise amplifier 12 disposed on the anode side of the PIN diode D2 is further increased. Since a large amount of the operating current flows in the low-noise amplifier 12 due to the high base voltage, the distortion characteristic in a high electric field range can be improved.

As noted above, according to the present embodiment, the PIN diode D2 is provided in the signal line 11. The PIN diode D1 is provided between the signal line 11 and ground so that an attenuating circuit is formed. The power supply B is applied to one end of the series circuit formed by the resistor R1 and the resistor R2. The other end of the series circuit is connected to ground through a drain-source path of the FET 2. The AGC voltage is applied to the gate of the FET 2. Therefore, a bias voltage (V1) in accordance with the AGC voltage can be applied to the base voltage of the low-noise amplifier 12 via the PIN diodes D1 and D2. Consequently, the sensitivity characteristic in a medium electric field range and the distortion characteristic in a high electric field range can be improved.

In addition, according to the present embodiment, the operating points in terms of on/off operations of the PIN diodes D1 and D2 can be freely determined by a voltage determined by the resistor R1 and the resistor R2. Therefore, the sensitivity characteristic in a medium electric field range and the distortion characteristic in a high electric field range can be improved.

Furthermore, according to the present embodiment, the AGC voltage is applied to the gate of the FET 2 so that the bias voltage V1 is generated in accordance with the amount of an electric current flowing in the drain-source path of the FET 2. Accordingly, the need for the AGC buffer amplifier 29 or 29' in the AGC voltage supply line L1 can be eliminated. Thus, the standardization of a circuit can be easily achieved.

Still furthermore, according to the present embodiment, the base voltage of the low-noise amplifier 12 is also used for the operating voltage of the PIN diode D2. Accordingly, the need for a dedicated bias circuit can be eliminated. Thus, the circuit scale can be decreased.

It should be understood that the present invention is not limited to the particular embodiment described above, but is intended to include all changes and modifications that are within the scope and spirit of the invention as set forth in the claims. For example, a configuration without the PIN diode D1 can be employed. Even when only the PIN diode D2 operates, the same advantage as described above can be provided.

Second Exemplary Embodiment

Figure 2:
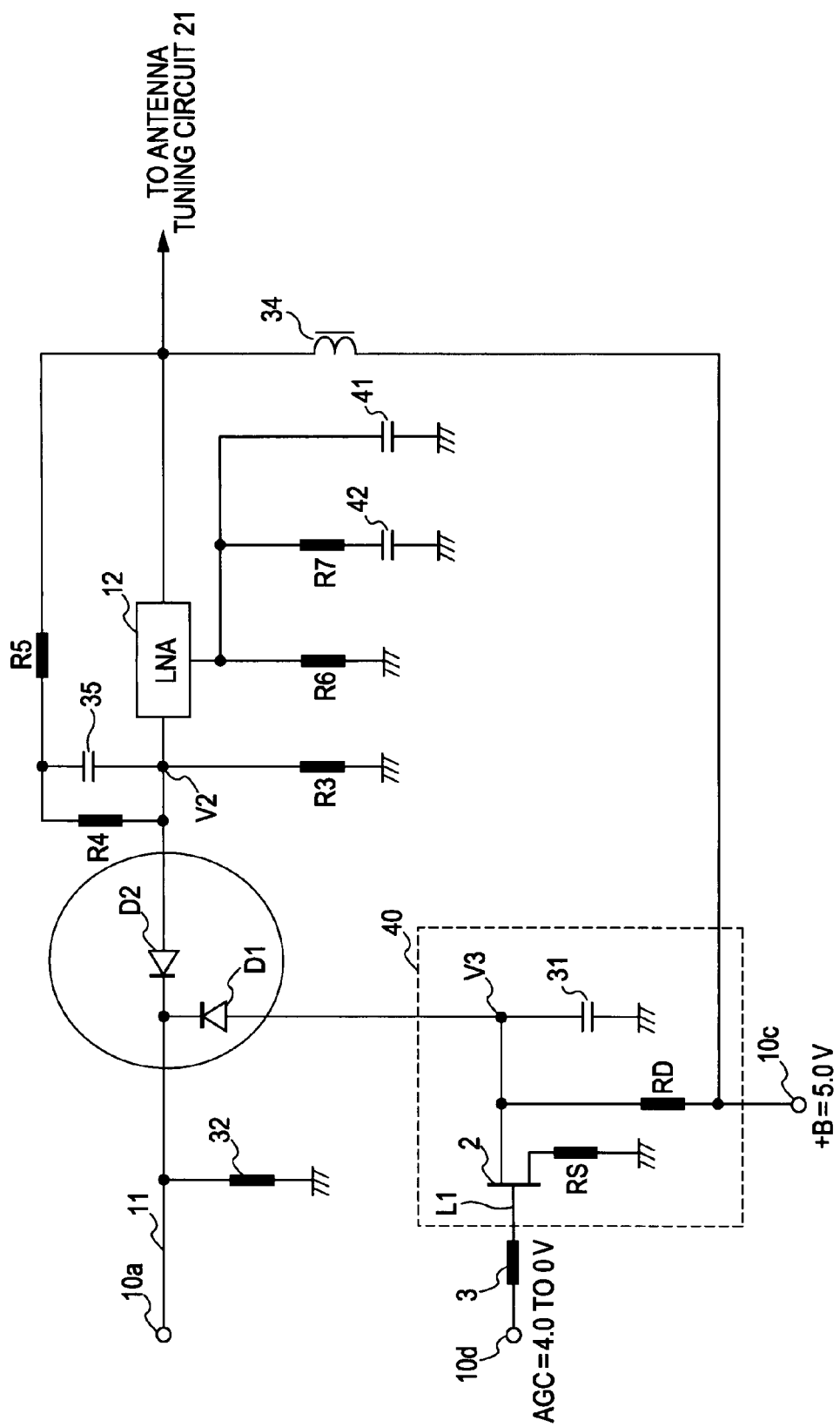
FIG. 2 is a block diagram of a high-frequency circuit according to a second exemplary embodiment of the present invention.

FIG. 2 illustrates an exemplary configuration of a high-frequency circuit according to a second exemplary embodiment. According to the second exemplary embodiment, the high-frequency circuit is applied to a television receiver system. Since stages downstream of the low-noise amplifier 12 are similar to those of the first exemplary embodiment, only parts different from the first exemplary embodiment are described below. Additionally, similar numbering will be used in describing the second exemplary embodiment as was utilized above in describing the first exemplary embodiment shown in FIG. 1. Therefore, descriptions of similar components are not repeated.

In a variable bias circuit 40, an AGC voltage supply line L1 is connected to the gate of an FET 2. The source of the FET 2 is connected to ground via a resistor RS. The drain of the FET 2 is connected to an anode of a PIN diode (a second PIN diode) D1 which is connected to ground via a capacitor 31 for high frequencies. A power supply voltage B is applied to a power supply terminal 10c and is applied to the drain of the FET 2 via a resistor RD.

A low-noise amplifier 12 can be composed of an amplifying device, such as a transistor or an FET. An input end (a base or a gate) of the low-noise amplifier 12 is connected to a signal line 11. An amplifying output end (a collector or a drain) of the low-noise amplifier 12 is connected to a circuit in a stage downstream of the low-noise amplifier 12. The ground end (an emitter or a source) is connected to ground via a resistor R6. The resistor R6 is a direct current setting resistor used for determining the level of a bias current flowing in the low-noise amplifier 12. The emitter or the source, which is the ground end of the low-noise amplifier 12, is connected to ground via a capacitor 41 for high frequencies. In addition, the emitter or the source is connected to a negative feedback circuit, which is connected to the resistor R6 in parallel. The negative feedback circuit includes a series circuit. The series circuit is formed by a resistor R7 and a capacitor 42. One end of the resistor R7 is connected to the emitter or the source of the low-noise amplifier 12. The other end of the resistor R7 is connected to one end of the capacitor 42. The other end of the capacitor 42 is connected to ground. The negative feedback circuit causes the frequency characteristic of the gain of the low-noise amplifier 12 to be flat by applying negative feedback to the low-noise amplifier 12. In particular, the negative feedback circuit operates so as to decrease the gain of the low-noise amplifier 12 in a low frequency range. According to the present exemplary embodiment, even when the input electric field changes, an amount of the negative feedback of the negative feedback circuit remains unchanged.

According to the present exemplary embodiment, in a low electric field range in which the AGC voltage is maximized, the PIN diode D1 enters an open state. In addition, an anode voltage (V3) of the PIN diode D1 is set to be less than the bias voltage V2 determined by the bias circuit (the resistors R3, R4, R5, and R6) of the low-noise amplifier 12.

In the high-frequency circuit having such a configuration, a high voltage (e.g., about 4 V) is applied to the gate of the FET 2 in a low electric field range in which the AGC voltage is at a high level. When a high voltage is applied to the gate of the FET 2, the FET 2 becomes electrically conductive, and therefore, an amount of an electric current flowing in a drain-source path of the FET 2 increases. Thus, the anode voltage V3 of the PIN diode D1 is decreased. Accordingly, the PIN diode D1 enters an open state. In contrast, the PIN diode D2 is controlled so as to be electrically conductive by the bias voltage V2 of the low-noise amplifier 12 applied to the anode of the PIN diode D2. Consequently, in a low electric field range in which the AGC voltage is at a high level, a high-frequency signal introduced to the signal line 11 is input to the low-noise amplifier 12 without being attenuated by the PIN diode D2 which is in a conductive state. The low-noise amplifier 12 performs an amplifying operation due to the bias voltage V2. The low-noise amplifier 12 amplifies the input signal and outputs the amplified signal. Since the AGC voltage in a low electrical field range does not make the PIN diode D1 electrically conductive due to the voltage V3 or makes the PIN diode D1 electrically conductive at a level that does not affect the reception sensitivity, attenuation of a signal is prevented.

In a medium electric field range in which the AGC voltage is decreased from the maximum value, the PIN diode D1 changes from an open state to a conductive state whereas the PIN diode D2 changes from a conductive state to an open state. As the cathode voltage (V3) of the PIN diode D2 increases, the bias voltage of the low-noise amplifier 12 increases, and therefore, the amount of the operating electric current increases. The bias voltage is determined so that the bias voltage at that time provides the optimum NF to the low-noise amplifier 12.

In a high electric field range in which the AGC voltage is further decreased from the maximum value, a low voltage (e.g., about 0 V) is applied to the gate of the FET 2. When a voltage of zero is applied to the gate of the FET 2, the anode voltage (V3) of the PIN diode D1 is maximized, and therefore, the PIN diode D1 becomes completely electrically conductive. The bias voltage V3 that causes a high operating current sufficient for improving the distortion characteristic to flow in the low-noise amplifier 12 is applied to the cathode of the PIN diode D2. Accordingly, in a high electric field range, the PIN diode D1 becomes completely conductive whereas the PIN diode D2 is turned off, and therefore, the attenuation of the high-frequency signal propagating in the signal line 11 increases. In addition, a high voltage (the bias voltage V3) is applied to the input end of the low-noise amplifier 12 from the variable bias circuit 1 and an amount of the operating electric current increases. As a result, the distortion characteristic can be improved.

As noted above, according to the present exemplary embodiment, the power supply voltage is applied to the drain of the FET 2 via the resistor RD. The source of the FET 2 is connected to ground via the resistor RS. The AGC voltage is applied to the gate of the FET 2. In addition, the anode of the PIN diode D1, which is connected to ground for high frequencies, is connected to the drain of the FET 2. Accordingly, the bias voltage (V3) in accordance with the AGC voltage can be applied to the base voltage of the low-noise amplifier 12 via the PIN diodes D1 and D2. Consequently, the sensitivity characteristic in a medium electric field range and the distortion characteristic in a high electric field range can be improved.

Third Exemplary Embodiment

Figure 3:
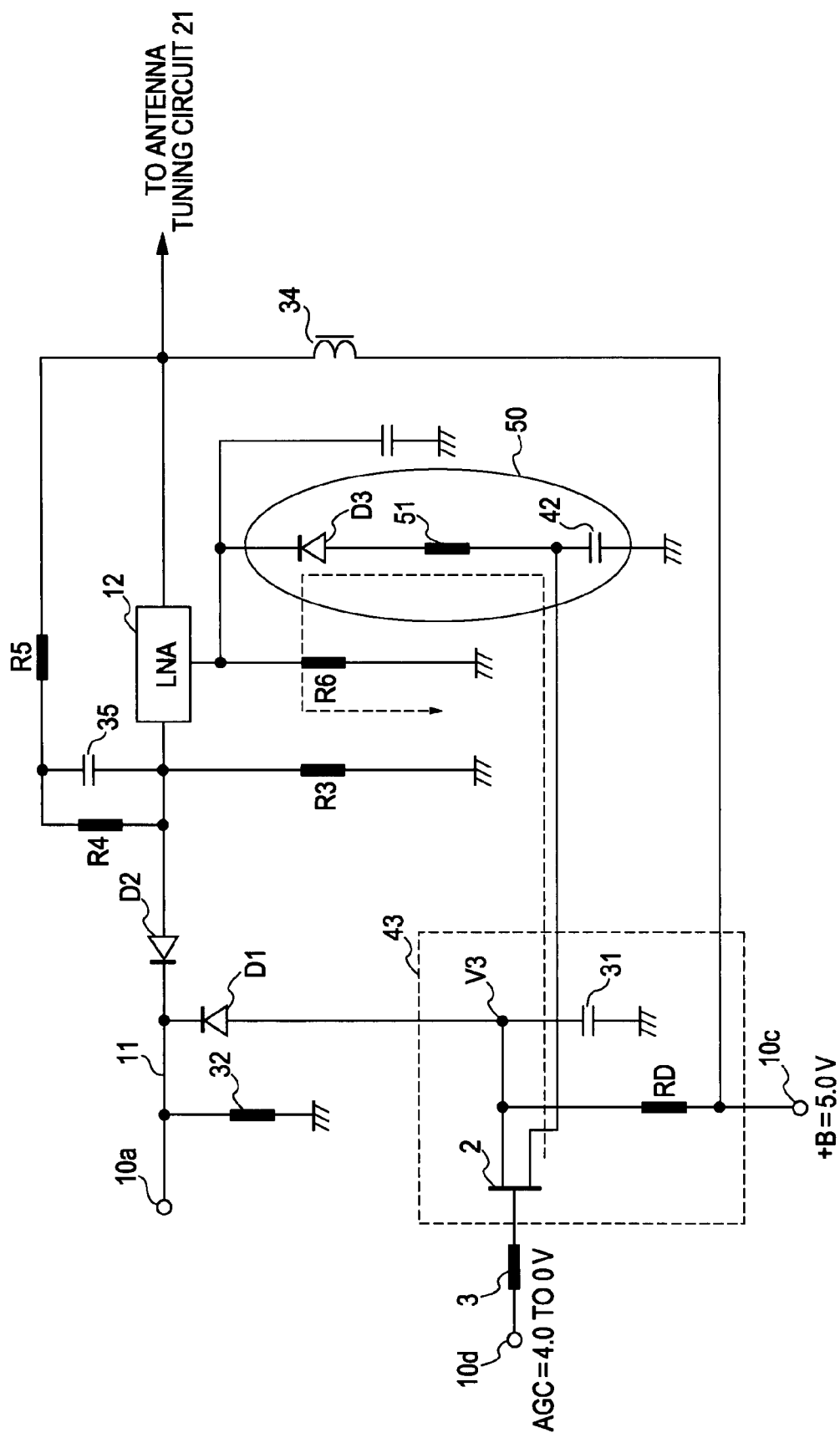
FIG. 3 is a block diagram of a high-frequency circuit according to a third exemplary embodiment of the present invention.

FIG. 3 illustrates an exemplary configuration of a high-frequency circuit according to a third exemplary embodiment. According to the third exemplary embodiment, the high-frequency circuit is applied to a television receiver system. Since stages downstream of the low-noise amplifier 12 are similar to those of the first exemplary embodiment, only parts different from the first exemplary embodiment are described below. Additionally, similar numbering will be used in describing the third exemplary embodiment as was utilized above in describing the first and second exemplary embodiments illustrated in FIGS. 1 and 2. Therefore, descriptions of similar components are not repeated.

A negative feedback circuit 50 having a resistance value changing in accordance with the AGC voltage is provided on the side of a ground end (a source or an emitter) of the low-noise amplifier 12. The negative feedback circuit 50 includes a series circuit composed of a PIN diode (a third PIN diode) D3, a resistor 51, and a capacitor 42 for high-frequency grounding. In the second exemplary embodiment, the source of the FET 2 is connected to ground via the resistor RS. However, according to the present embodiment, the source of the FET 2 is connected to a point between the capacitor 42 and a grounding terminal of the resistor 51. Accordingly, the output from the source of the FET 2 that varies in accordance with the AGC voltage is applied to an anode of the PIN diode D3 via the resistor 51. Since the resistance value of the PIN diode D3 changes in accordance with the output from the source, the total resistance value of the negative feedback circuit 50 changes in accordance with the AGC voltage.

The operation of the present embodiment having such a configuration is described in detail next.

The source voltage appearing at the source of the FET 2 exhibits a characteristic having a tendency of an increase and a decrease that is the same as that in the AGC voltage applied to the gate of the FET 2. That is, the source voltage is at a high level in a range from a low electric field to a medium electric field range in which the AGC voltage is at a relatively high level. Accordingly, a voltage having a level sufficient for causing the PIN diode D3 to be electrically conductive is applied to the anode of the PIN diode D3 of the negative feedback circuit 50 to which the source voltage is applied. Since the PIN diode D3 becomes electrically conductive due to a sufficiently high direct current, the series resistance value of the PIN diode D3 is minimized, and therefore, the amount of negative feedback of the negative feedback circuit 50 is minimized. As a result, in the range from a low electric field to a medium electric field in which the AGC voltage is at a relatively high level, the gain of the low-noise amplifier 12 is maximized.

When the input electric field is in a range from a medium electric field to a high electric field, the AGC voltage decreases in accordance with the electric field intensity. When the AGC voltage applied to the gate of the FET 2 decreases, the source voltage of the FET 2 decreases. The voltage applied to the anode of the PIN diode D3 decreases with the decrease in the source voltage of the FET 2, and therefore, the voltage is minimized in the high electric field range. As the anode voltage of the PIN diode D3 decreases, the series resistance value of the PIN diode D3 gradually increases. Thus, the amount of negative feedback of the negative feedback circuit 50 increases. As a result, in a high electric field range in which the AGC voltage is at a low level, the gain of the low-noise amplifier 12 decreases.

As noted above, by supplying the source voltage of the FET 2 that changes in a similar fashion as the AGC voltage to the PIN diode D3 provided in the negative feedback circuit 50, the total resistance value of the negative feedback circuit 50 can be changed while following a change in the AGC voltage. Thus, the amount of negative feedback of the low-noise amplifier 12 can be optimally controlled in accordance with the input electric field so that a high gain and low noise can be achieved in a range from a low electric field to a medium electric field. In addition, in a high electric field range, low distortion can be achieved by decreasing the gain. By supplying the source output of the FET 2 to the negative feedback circuit 50 of the low-noise amplifier 12, the total resistance value of the negative feedback circuit 50 can be controlled without providing a volume control to the negative feedback circuit 50. Therefore, the number of components can be reduced at the same time.

Figure 4A:
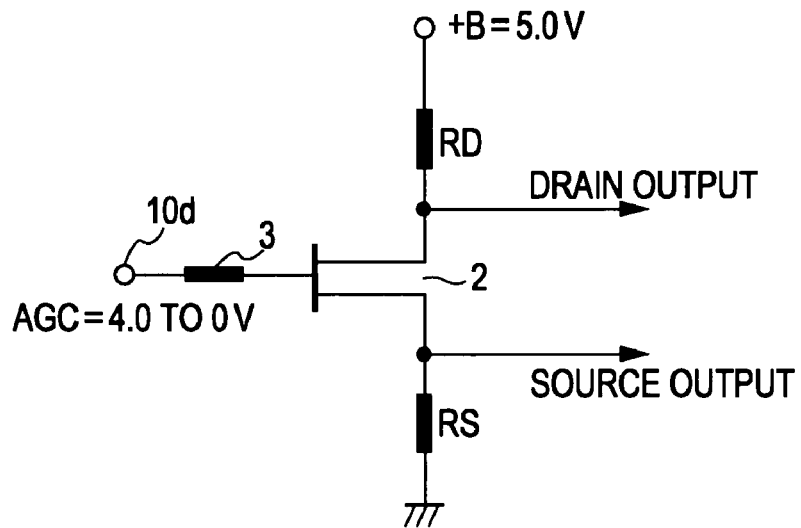
FIG. 4A schematically illustrates a portion that retrieves a drain output and a source output according to the third exemplary embodiment of the present invention.

FIG. 4A schematically illustrates the case in which, according to the third exemplary embodiment, a drain output of the FET 2 supplied to the attenuating circuit (the PIN diode D1) is retrieved by the resistor RD connected to the drain of the FET 2, and a source output of the FET 2 supplied to the negative feedback circuit 50 (the PIN diode D3) is retrieved by the resistor RS connected to the source of the FET 2. The series circuit formed from the resistor 51 of the negative feedback circuit 50, the PIN diode D3 (a resistance component), and the resistor R6 shown in the circuit diagram of FIG.

Figure 4B:
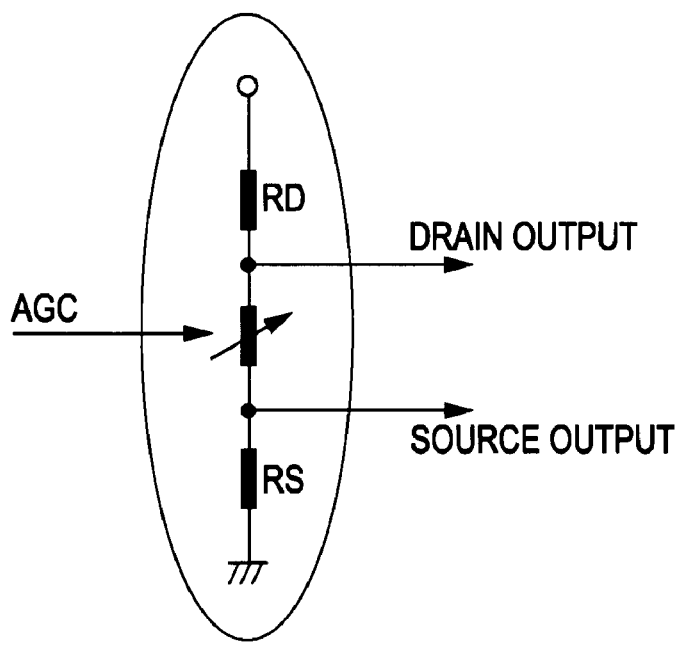
FIG. 4B is an equivalent circuit diagram of the diagram shown in FIG. 4A.

3 corresponds to the resistor RS shown in FIG. 4A. FIG. 4B is an equivalent circuit diagram in which the drain-source path of the FET 2 having a resistance value changed in accordance with the AGC voltage is shown as a variable resistor. As can be seen from the equivalent circuit, the drain output is determined by a bleeder voltage determined by a resistance value of the resistor RD and a resistance value determined by the resistor RS and the variable resistor. The source output is a bleeder voltage determined by a resistance value of the resistor RS and a resistance value determined by the resistor RD and the variable resistor. That is, the resistance value of the second PIN diode D1 is variably controlled by the drain output that changes in accordance with the AGC voltage. In addition, the resistance value of the third PIN diode D3, that is, the total resistance value of the negative feedback circuit 50 is variably controlled by the source output that changes in accordance with the AGC voltage.

FIG. 5 is a characteristic diagram illustrating a relationship between the AGC voltage and the drain voltage of the FET 2 when a ratio of a resistance of the resistor RD to a resistance of the resistor RS shown in FIGS. 4A and 4B is changed. As can be seen from FIG. 5, by changing the ratio of the resistance of the resistor RD to the resistance of the resistor RS, the rising characteristic of the drain voltage with respect to the AGC voltage can be changed.

Figure 6:
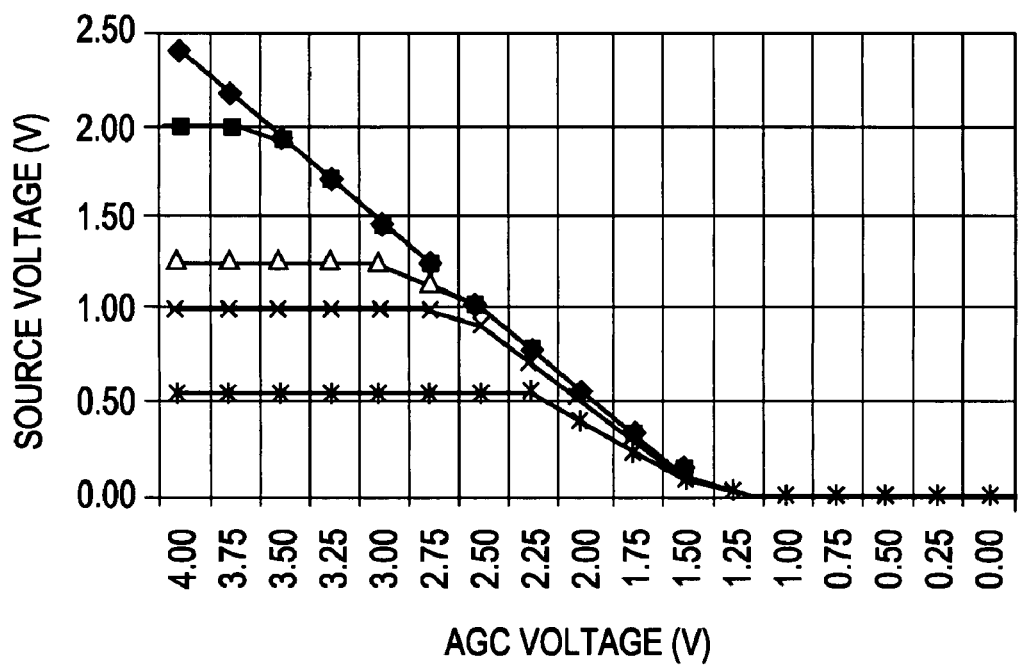
FIG. 6 is a characteristic diagram illustrating a relationship between a source voltage and the AGC voltage shown in FIG. 4A.
Figure 7:
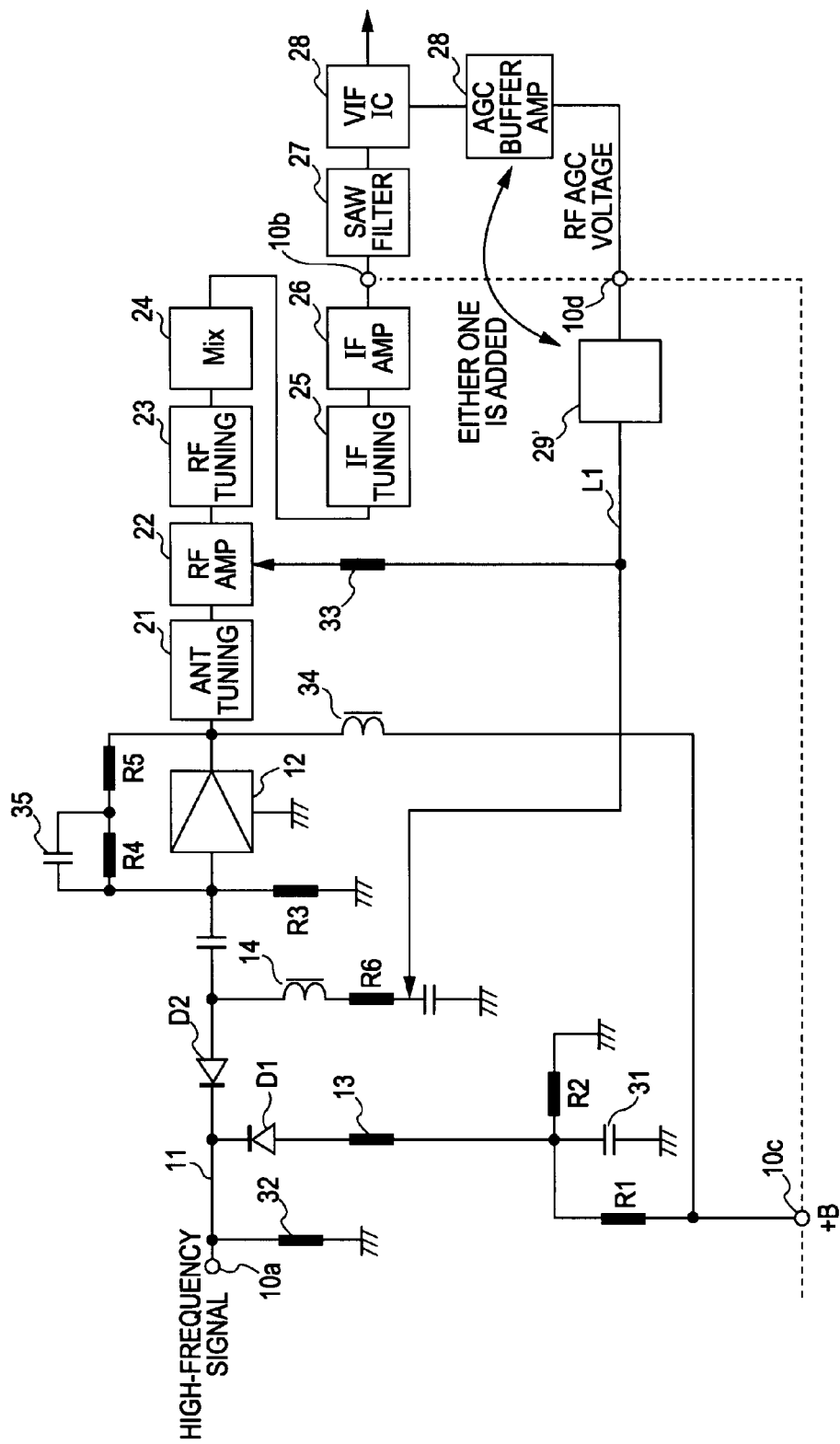
FIG. 7 illustrates an example of an existing high-frequency circuit including an attenuating circuit having a PIN diode and disposed upstream of a low-noise amplifier.
Figure 8A:
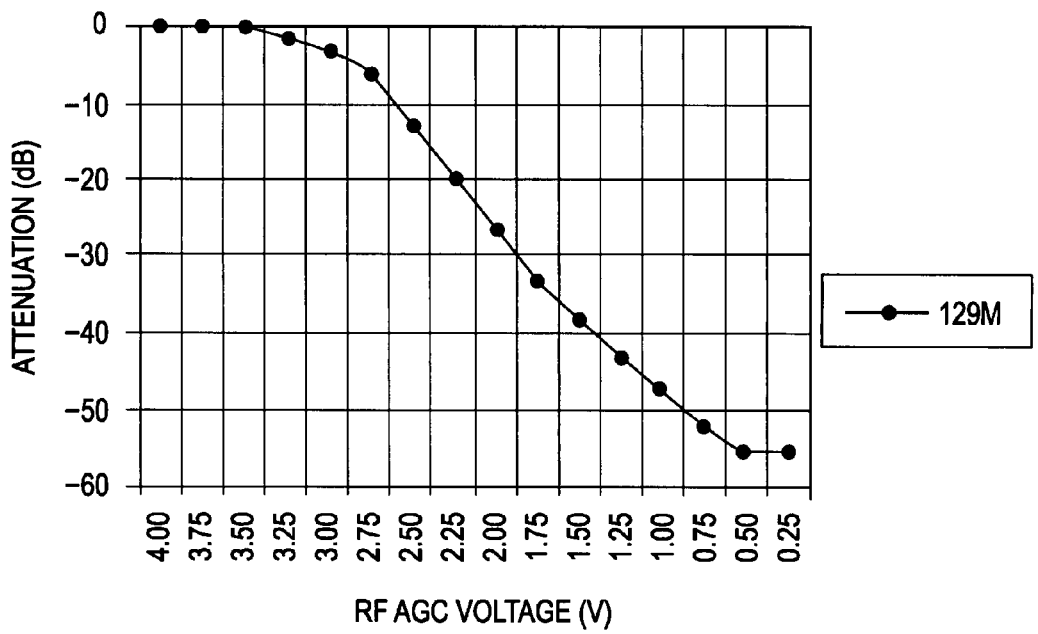
FIG. 8A is a characteristic diagram illustrating a relationship between the AGC voltage of an RF amplifier and the attenuation.
Figure 8B:
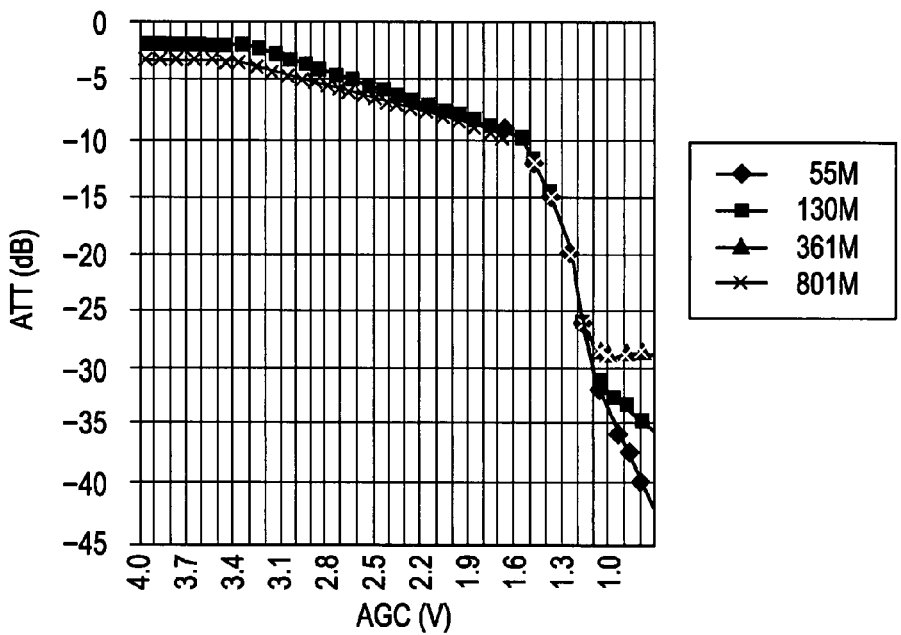
FIG. 8B is an attenuation characteristic diagram illustrating a relationship between the AGC voltage and attenuation of an attenuating circuit having a PIN diode.

FIG. 6 is a characteristic diagram illustrating a relationship between the AGC voltage and the source voltage of the FET 2 when a ratio of a resistance of the resistor RD to a resistance of the resistor RS shown in FIGS. 4A and 4B is changed. As can be seen from FIG. 6, by changing the ratio of the resistance of the resistor RD to the resistance of the resistor RS, the rising characteristic of the source voltage with respect to the AGC voltage can be changed.

As noted above, by changing the ratio of the resistance of the resistor RD to the resistance of the resistor RS, the rising characteristics of the drain voltage and the source voltage with respect to the AGC voltage can be changed. Accordingly, by changing the ratio of the resistance of the resistor RD to the resistance of the resistor RS, a desired characteristic can be obtained.

While the present invention has been described with reference to the foregoing embodiments using a high-frequency circuit of a television receiver system, the present invention is not limited to a high-frequency circuit of a television receiver system. For example, the present invention is applicable to any high-frequency circuit in which attenuation of an attenuating circuit including a PIN diode is controlled in accordance with an input signal level.

What is claimed is:

1. A high-frequency circuit comprising:
a first PIN diode disposed in a signal line to which a high-frequency signal is introduced, one end of the first PIN diode on the high-frequency signal input side being connected to ground via a resistor;
an amplifying device, an input end of the amplifying device being connected to the other end of the first PIN diode for a direct current;
a bias circuit connected to the input end of the amplifying device; and
a variable bias circuit to which a control voltage is supplied from a control voltage supply line, the control voltage being applied to the control voltage supply line in accordance with the signal level of the input high-frequency signal, the variable bias circuit generating a variable bias voltage in accordance with the control voltage and applying the variable bias voltage to the one end of the first PIN diode so as to control attenuation of the first PIN diode and control an operating current of the amplifying device.

2. The high-frequency circuit according to claim 1, wherein the variable bias circuit includes an FET having a gate connected to the control voltage supply line and a source connected to ground, and wherein the variable bias circuit further includes two resistors connected in series between a drain of the FET and a power supply, and a connection point of the two resistors is connected to the one end of the first PIN diode.

3. The high-frequency circuit according to claim 2, wherein a second PIN diode is connected between the one end of the first PIN diode and the connection point of the two resistors.

4. The high-frequency circuit according to claim 1, wherein the amplifying device includes one of an FET and a transistor, and wherein the bias circuit includes a resistor connected between a gate or a base of the amplifying device and ground and a resistor connected between the gate or the base of the amplifying device and a power supply, and wherein the bias circuit applies a bias voltage applied to the gate or the base of the amplifying device to the other end of the first PIN diode.

5. The high-frequency circuit according to claim 1, wherein an AGC voltage in accordance with a signal level of a high-frequency signal output from an AGC circuit connected to a stage downstream of the amplifying device is supplied to the control voltage supply line as the control voltage.

6. The high-frequency circuit according to claim 1, wherein the variable bias circuit includes an FET having a gate connected to the control voltage supply line, a source connected to ground via a resistor, and a drain connected to a power supply via a resistor, and wherein the drain of the FET is connected to the one end of the first PIN diode.

7. The high-frequency circuit according to claim 6, wherein the amplifying device includes one of an FET and a transistor, and a direct current setting resistor is connected between a source or an emitter of the amplifying device and ground, and wherein a source of the FET is connected to ground for high frequencies, a third PIN diode is connected between one end of a resistor having the other end connected to the source of the FET and the source or the emitter of the amplifying device, and wherein the resistance value of the third PIN diode is controlled by a source voltage of the FET.

8. A high-frequency circuit comprising:
an attenuating circuit including a first PIN diode, the first PIN diode being disposed in a signal line to which a high-frequency signal is introduced;
an amplifying device connected to a stage downstream of the attenuating circuit, the amplifying device including a feedback circuit; and
a variable bias circuit to which a control voltage is supplied from a control voltage supply line, the control voltage being applied to the control voltage supply line in accordance with the input signal level of the high-frequency signal, the variable bias circuit generating variable bias voltages supplied to the first PIN diode and the feedback circuit in accordance with the control voltage, the variable bias circuit controlling attenuation of the first PIN diode using the variable bias voltage applied to one end of the first PIN diode and controlling an amount of feedback of the feedback circuit using the variable bias voltage applied to one end of a third PIN diode.

9. The high-frequency circuit according to claim 8, wherein the variable bias circuit includes an FET having a gate connected to the control voltage supply line and a drain connected to a power supply via a resistor, the drain of the FET of the variable bias circuit is connected to the one end of the first PIN diode, the source of the FET of the variable bias circuit is connected to ground for high frequencies, one end of a resistor is connected to the source of the FET, the amplifying device includes one of an FET and a transistor, a direct current setting resistor is connected between a source or an emitter of the amplifying device and ground, and the third PIN diode is connected between the other end of the resistor connected to the source of the FET of the variable bias circuit and the source or the emitter of the amplifying device, and wherein the resistance value of the third PIN diode is controlled by a source voltage of the FET of the variable bias circuit.

* * * * *